United States Patent
French et al.

(10) Patent No.: US 6,667,435 B1
(45) Date of Patent: Dec. 23, 2003

(54) MAGNETIC GASKET FOR FASTENING ELECTRONIC COMPONENTS

(75) Inventors: Roger A. French, Forest Grove, OR (US); Ezra T. Peachey, Blaine, WA (US)

(73) Assignee: Intel Corporation, Santa Clara, CA (US)

( * ) Notice: Subject to any disclaimer, the term of this patent is extended or adjusted under 35 U.S.C. 154(b) by 808 days.

(21) Appl. No.: 09/049,036

(22) Filed: Mar. 27, 1998

(51) Int. Cl.[7] .................................................. H05K 9/00
(52) U.S. Cl. ............................. 174/35 GC; 174/35 MS; 49/478.1; 277/590; 277/920; 277/944
(58) Field of Search ..................... 174/35 GC, 35 MS, 174/35 R; 49/478.1; 312/296; 62/440; 277/639, 944, 920, 651, 590; 361/679

(56) References Cited

U.S. PATENT DOCUMENTS

| | | | | |
|---|---|---|---|---|
| 3,026,367 A | * | 3/1962 | Hartwell | 174/35 GC |
| 3,889,043 A | * | 6/1975 | Jean Ducros | 174/35 GC |
| 3,969,572 A | * | 7/1976 | Rostek | 174/35 MS |
| 4,110,552 A | * | 8/1978 | Lombardi | 174/35 MS |
| 4,934,666 A | * | 6/1990 | Balsells | 267/1.5 |
| 5,045,635 A | * | 9/1991 | Kaplo et al. | 174/35 GC |
| 5,160,806 A | * | 11/1992 | Harada et al. | 174/35 GC |
| 5,202,536 A | * | 4/1993 | Buonanno | 174/35 GC |
| 5,309,680 A | * | 5/1994 | Kiel | 49/478.1 |
| 5,351,812 A | * | 10/1994 | Eagon | 206/1.7 |
| 5,826,638 A | * | 10/1998 | Jelic | 160/107 |

OTHER PUBLICATIONS

Electromagnetics, third edition, by John D. Kraus, pp. 216, 217, 231–233,238,239, no date.*

* cited by examiner

*Primary Examiner*—Thomas G. Black
*Assistant Examiner*—Ronnie Mancho
(74) *Attorney, Agent, or Firm*—Kenyon & Kenyon

(57) ABSTRACT

A magnetic gasket that fastens together components in an electronic device. An adhesive, such as a pressure sensitive adhesive, is attached to a magnetic strip. An electrically conductive gasket, such as a soft foam core with a conductive fabric wrap, is also attached to the magnetic strip. The adhesive attaches the magnetic gasket to one component, and the magnetic strip holds another metallic component firmly in place. This compresses the electrically conductive gasket, filling the gap between the components with an electrical connection that reduces EMI.

15 Claims, 2 Drawing Sheets

MAGNETIC GASKET FOR FASTENING ELECTRONIC COMPONENTS

FIELD OF THE INVENTION

The present invention relates to the construction of electronic devices. More particularly, the present invention relates to a magnetic gasket that can be used to fasten together components in an electronic device.

BACKGROUND OF THE INVENTION

Electronic devices often include components that need to be fastened together. For example, a personal computer's metallic housing may need to be fastened to a metallic side panel of the computer's chassis. The components often need to be removable, so bonding them together using, for example, an adhesive is not practical. Typically, such components are connected using screws, hooks or other fasteners. This, however, makes assembling or disassembling the components difficult. For example, the fasteners in an electronic device may be very small and therefore troublesome to use. Such fasteners are also easily lost. Other fasteners may require a special tool, such as a screwdriver, to operate. Moreover, a single electronic device may use many different types of fasteners, which can be confusing.

Another problem that arises when components in an electronic device are fastened together is the emission of electromagnetic interference (EMI). EMI refers to unwanted electrical noise that "leaks" from a component and interferes with other components. Such leakage can be, for example, a magnetic field that adversely affects electronic equipment and causes intermittent data problems.

Uncontrolled EMI is undesirable because it can result in problems within the electronic device emitting the EMI, as well as problems with nearby electronic systems. Products, such as consumer devices, may also need to meet Federal Communications Commission (FCC) regulations related to EMI emissions in order to be sold in the U.S. For example, an electronic device may need to comply with FCC Docket Number 20780, Subpart 15, Class "A" or "B." Other countries have similar EMI standards.

To control EMI, it is known that an electrically conductive gasket, or "shield," can seal a product and prevent the emission of EMI. Such a shield is created by placing the gasket between the components that are fastened together. The gasket is usually deformable, and is compressed by the force of a screw, or other fastener, holding the components together. This maintains an electrical connection across the gap between the two components, acting as a shield that reduces the EMI escaping from the device. Using a conductive gasket along with screws, or other fasteners, makes assembling or disassembling the components even more difficult.

In view of the foregoing, it can be appreciated that a substantial need exists for an apparatus that simply fastens together components in an electronic device and reduces EMI, and solves the other problems discussed above.

SUMMARY OF THE INVENTION

In accordance with an embodiment of the present invention, an adhesive is attached to a first side of a magnetic strip. An electrically conductive gasket is attached to a second side of the magnetic strip.

DETAILED DESCRIPTION

Figure 1:
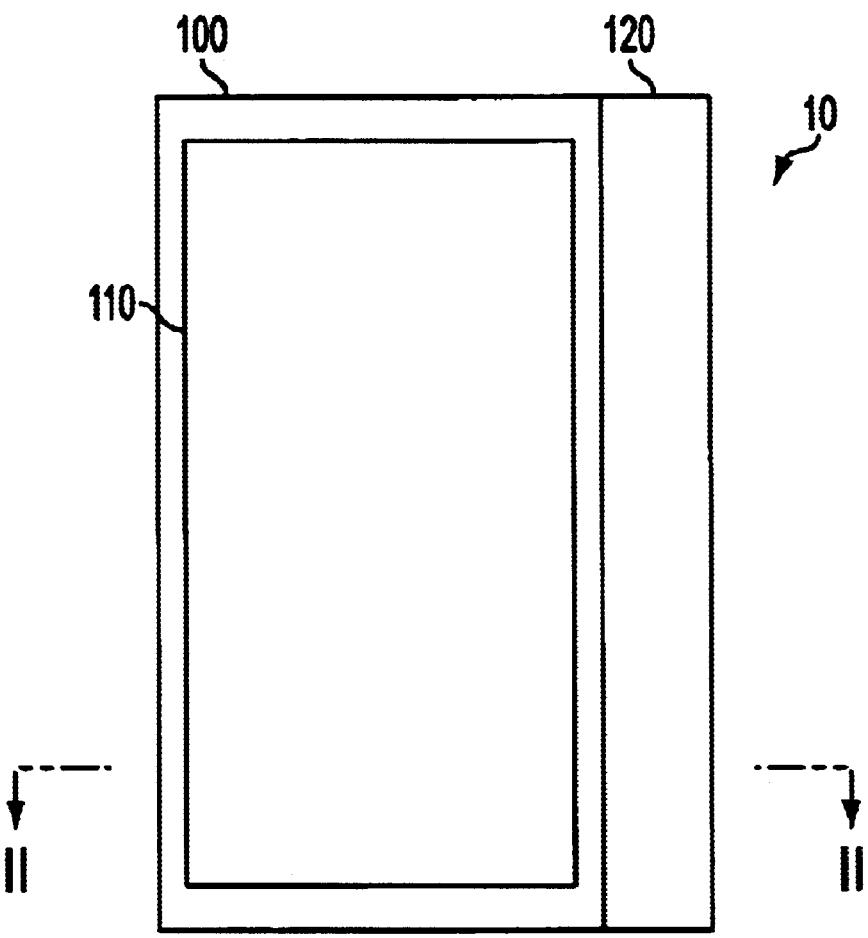
FIG. 1 shows a magnetic gasket according to an embodiment of the present invention.

An embodiment of the present invention is directed to a magnetic gasket that fastens together components in an electronic device. Referring now in detail to the drawings wherein like parts are designated by like reference numerals throughout, FIG. 1 shows a magnetic gasket 10 according to an embodiment of the present invention. The magnetic gasket 10 includes a magnetic strip 100 which can be used, for example, to hold portions of an electronic device's steel enclosure to a main chassis. The magnetic strip 100 can be flexible, such as a magnet formed of pliable rubber. Such magnets can also be cut to custom lengths, simplifying production of magnetic gaskets. The strip 100 should be magnetically strong enough to hold the components firmly together. Even so, it may still be possible to unfasten the components without using a special tool.

An adhesive 110 is affixed to one side of the magnetic strip 100. The adhesive 110 could be, as is well known in the art, a pressure sensitive adhesive that creates a bond when pressure is applied, such as a number of adhesives commonly available from 3M. The adhesive 110 lets the magnetic strip 100 be bonded to a component in an electronic device. This component can then be fastened to an appropriate metallic mating component by magnetic attraction. The adhesive 110 can cover substantially all of a side of the magnetic strip 100, or only a portion of a side, as required.

Also affixed to a side of the magnetic strip 100 is an electrically conductive gasket 120. The electrically conductive gasket 120 can made of, for example, a deformable material, such as a soft foam core, with a conductive fabric wrap. The materials used in the electrically conductive gasket 120 can be similar to those currently used for EMI shields in electronic devices. The electrically conductive gasket 120 attaches to one or more surfaces of the magnetic strip 100 and provides contact between the metallic components being fastened together. One advantage of this construction is that nothing comes between the magnetic strip 100 and the parts being magnetically retained, allowing for the strongest magnetic retention force.

Figure 2:
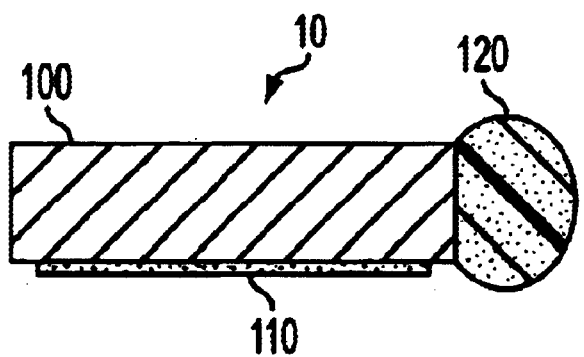
FIG. 2 is a view of the magnetic gasket shown in FIG. 1 taken along cross-section line II—II.
Figure 3:
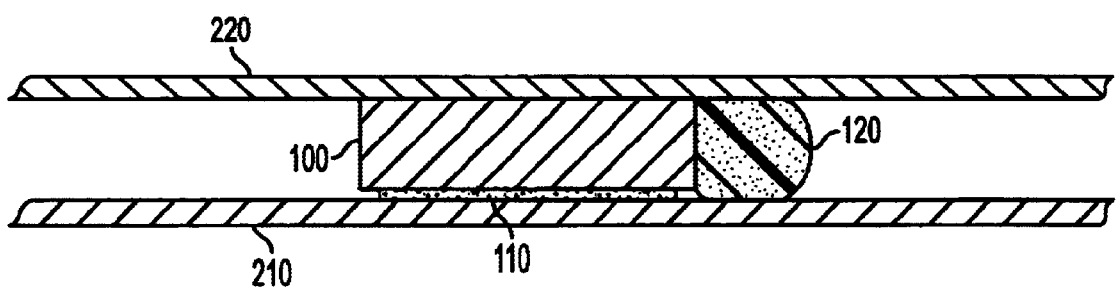
FIG. 3 shows the magnetic gasket of FIG. 1 being used to fasten two components according to an embodiment of the present invention.

FIG. 2 is a view of the magnetic gasket 10 shown in FIG. 1 taken along cross-section line II—II. As can be seen, the electrically conductive gasket 120 extends beyond opposite sides of the magnetic strip 100. If the electrically conductive gasket 120 is deformable, it will be compressed when two components are fastened together. This is shown in FIG. 3, which illustrates the magnetic gasket 10 being used to fasten two components 210, 220 in an electronic device according to an embodiment of the present invention. The components could be, for example, a server computer's steel enclosure and a main chassis. The adhesive 110 holds the magnetic strip 100 to one component 210. The component 220 contains magnetic material, such as iron, and is therefore attracted by the magnetic force of the magnetic strip 100. Thus, the two components 210, 220 are kept firmly in place.

The attraction also deforms the electrically conductive gasket 120, causing it to completely fill the gap between the two components 210, 220. This ensures that a conductive path exists between the components 210, 220 to form a shield that prevents the emission of EMI. Moreover, the magnetic gasket 10 lets the metallic components 210, 220 be connected without the use of screws or other fasteners, and the parts can be easily disassembled without special tools.

Figure 4:
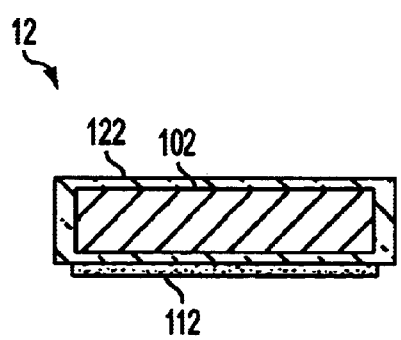
FIG. 4 is a magnetic gasket according to another embodiment of the present invention.

In addition to the embodiment shown in FIGS. 1 to 3, FIG. 4 illustrates a magnetic gasket 12 according to another embodiment of the present invention. A magnetic strip 102 is surrounded by an electrically conductive layer 122. The magnetic strip 102 could be, for example, plated, painted or coated with a conductive material. The electrically conductive layer 122 could also be formed using a conductive net, fabric, foil or film surrounding the magnetic strip 102. Although the magnetic strip 102 shown in FIG. 4 is completely surrounded by the electrically conductive layer 122, it is sufficient to only have the electrically conductive layer 122 connect opposite sides of the magnetic strip 102. In this way, a conductive path will be formed between the components that are fastened together.

As before, an adhesive 112, such as a pressure sensitive adhesive, is used to bond the magnetic gasket 12 to one component. However, in this embodiment the adhesive is preferably conductive to ensure that a conductive path between the components is maintained.

Although various embodiments are specifically illustrated and described herein, it will be appreciated that modifications and variations of the present invention are covered by the above teachings and within the purview of the appended claims without departing from the spirit and intended scope of the invention. For example, although an electrically conductive gasket running along a single side of the magnetic strip was used to illustrate the embodiment shown in FIGS. 1 to 3, it will be appreciated that an electrically conductive gasket running along two or more sides of a magnetic strip could also fall within the scope of the invention.

What is claimed is:

1. A magnetic gasket to fasten together components in an electronic device, comprising:

magnetic strip with an essentially rectangular crosssection having a first, second, third, and fourth sides, with said first and third and second and fourth sides respectively opposed to each other, said second side being substantially perpendicular to said first side;

an adhesive layer attached to the first side of said magnetic strip; and an electrically conductive gasket made of a deformable material that extends beyond said opposed first and third sides attached to the second side of said magnetic strip.

2. The magnetic gasket of claim 1, wherein said adhesive layer is configured to adhere to a first component and said magnetic strip to magnetically adhere to a second component with said electrically conductive gasket is configured to electrically connect the first component with the second component.

3. The magnetic gasket of claim 1, wherein said magnetic strip is flexible.

4. The magnetic gasket of claim 1, wherein said adhesive layer is made of a pressure sensitive adhesive.

5. The magnetic gasket of claim 1, wherein said electrically conductive gasket is made of a soft foam core with a conductive fabric wrap.

6. The magnetic gasket of claim 1, wherein said first and third sides form long edges of the rectangular cross section and the second and fourth sides form short edges of the rectangular cross section.

7. The magnetic gasket of claim 1, wherein the adhesive layer covers substantially all of said first side.

8. A magnetic gasket to fasten together components in an electronic device, comprising:

magnetic strip with an essentially rectangular crosssection having a first, second, third, and fourth sides, with said first and third and second and fourth sides respectively opposed to each other, said second side being substantially perpendicular to said first side;

an electrically conductive layer on said magnetic strip, the electrically conductive layer conductively connecting said first and third sides of said magnetic strip; and an electrically conductive adhesive layer attached to said electrically conductive layer at said first side of said magnetic strip, said adhesive layer being located on a surface of said electrically conductive layer away from said magnetic strip.

9. The magnetic gasket of claim 8, wherein said electrically conductive layer surrounds said magnetic strip.

10. The magnetic gasket of claim 8, wherein said electrically conductive layer is plated, painted or coated on said magnetic strip.

11. The magnetic gasket of claim 8, wherein said electrically conductive layer is a conductive net, fabric, foil or film.

12. The magnetic gasket of claim 8, wherein said magnetic strip is flexible.

13. The magnetic gasket of claim 8, wherein said adhesive layer comprises a pressure sensitive adhesive.

14. The magnetic gasket of claim 8, wherein the adhesive layer covers substantially all of the surface of said electrically conductive layer.

15. A magnetic gasket to fasten together a first component and a second component in an electronic device, comprising:

a magnetic strip;

an adhesive layer attached to said magnetic strip; and an electrically conductive gasket attached to said magnetic strip, said electrically conductive gasket being configured to electrically connect the first component to the second component.

* * * * *